United States Patent
Bereza et al.

(10) Patent No.: US 7,239,849 B2
(45) Date of Patent: Jul. 3, 2007

(54) ADAPTIVE COMMUNICATION METHODS AND APPARATUS

(75) Inventors: Bill Bereza, Nepean (CA); Mashkoor Baig, Ottawa (CA); Shoujun Wang, Nepean (CA); Haitao Mei, Ottawa (CA); Tad Kwasniewski, Ottawa (CA)

(73) Assignee: Altera Corporation, San Jose, CA (US)

( * ) Notice: Subject to any disclaimer, the term of this patent is extended or adjusted under 35 U.S.C. 154(b) by 785 days.

(21) Appl. No.: 10/702,196

(22) Filed: Nov. 4, 2003

(65) Prior Publication Data

US 2005/0095988 A1    May 5, 2005

(51) Int. Cl.
*H04B 17/00*    (2006.01)
(52) U.S. Cl. .................. 455/67.14; 455/67.16; 455/69; 455/115.1; 455/115.2; 370/335
(58) Field of Classification Search ............ 455/67.14, 455/67.16, 69, 115.1, 115.2
See application file for complete search history.

(56) References Cited

U.S. PATENT DOCUMENTS

| | | | | |
|---|---|---|---|---|
| 3,633,120 A | | 1/1972 | Battjes | 330/30 R |
| 4,591,792 A | * | 5/1986 | Birchmeier et al. | 324/425 |
| 4,723,110 A | | 2/1988 | Voorman | 330/252 |
| 4,871,981 A | * | 10/1989 | Franklin | 331/1 A |
| 5,420,538 A | | 5/1995 | Brown | 330/252 |
| 6,236,231 B1 | | 5/2001 | Nguyen et al. | 326/39 |
| 6,492,914 B2 | * | 12/2002 | Katoh | 341/50 |
| 6,650,140 B2 | | 11/2003 | Lee et al. | 326/39 |
| 6,674,794 B1 | * | 1/2004 | Pilozzi et al. | 375/222 |
| 6,845,126 B2 | * | 1/2005 | Dent et al. | 375/219 |
| 6,915,112 B1 | * | 7/2005 | Sutton et al. | 455/67.13 |
| 2002/0113725 A1 | * | 8/2002 | Katoh | 341/155 |
| 2003/0052709 A1 | | 3/2003 | Venkata et al. | 326/37 |
| 2003/0141919 A1 | | 7/2003 | Wang et al. | |
| 2005/0201500 A1 | * | 9/2005 | Shizuki | 375/350 |

OTHER PUBLICATIONS

U.S. Appl. No. 10/317,262, filed Dec. 10, 2002, Venkata et al.
U.S. Appl. No. 10/317,264, filed Dec. 10, 2002, Venkata et al.
U.S. Appl. No. 10/349,541, filed Jan. 21, 2003, Venkata et al.
U.S. Appl. No. 10/454,626, filed Jun. 3, 2003, Lui et al.
U.S. Appl. No. 10/640,824, filed Aug. 13, 2003, Wang et al.
U.S. Appl. No. 10/640,825, filed Aug. 13, 2003, Wang et al.
U.S. Appl. No. 10/702,195, filed Nov. 4, 2003, Baig et al.
U.S. Appl. No. 10/756,949, filed Jan. 13, 2004, Kwasniewski et al.
U.S. Appl. No. 10/757,182, filed Jan. 13, 2004, Baig et al.
B. Gilbert, "The Multi-Tanh Principle: A Tutorial Overview", IEEE Journal of Solid-State Circuits, vol. 33, No. 1, Jan. 1998.

* cited by examiner

*Primary Examiner*—Matthew Anderson
*Assistant Examiner*—Minh Dao
(74) *Attorney, Agent, or Firm*—Fish & Neave IP Group, Ropes & Gray LLP; Robert R. Jackson

(57) ABSTRACT

Possible deficiencies of a communication link are detected and automatically counteracted, at least to some degree. The deficiencies addressed can include phase shift and attenuation compensation. The counter-action can include adjustment of pre-emphasis given a signal applied to the communication link and/or adjustment of equalization given a signal received from the communication link.

42 Claims, 2 Drawing Sheets

ADAPTIVE COMMUNICATION METHODS AND APPARATUS

BACKGROUND OF THE INVENTION

This invention relates to communication between devices in a system, and more particularly to methods and apparatus for automatically adjusting transmission and/or reception of signals to compensate for deficiencies in the communication link being used.

Circuitry via which it is desired to send a signal may have various deficiencies that adversely affect transmission of the signal. For example, the communication link may somewhat attenuate (weaken) the signal and/or the communication link may introduce a phase shift into the signal. The magnitudes of these various deficiencies (e.g., attenuation and/or phase shift) may depend on the frequency(ies) of the signal being transmitted. These deficiencies can make it more difficult or even impossible to reliably receive a signal that has been transmitted, especially at certain frequencies or in certain frequency ranges.

Pre-emphasis and equalization are known techniques for attempting to compensate for deficiencies in a communication link. Pre-emphasis is used at the transmitter and involves giving the signal transmitted some extra energy for a certain amount of time after each change in level of the signal. Equalization is used at the receiver and involves initially responding more strongly to each change in level of the received signal. Each communication link is, however, potentially different. Also, some components (e.g., programmable logic devices or PLDs) are manufactured to be general-purpose devices to at least some degree, so that it may not be known by the manufacturer what use will be made of those devices (e.g., what communication links and frequencies they will be used with). It can accordingly be difficult or impossible to build into communication devices the appropriate amount of pre-emphasis and/or equalization.

SUMMARY OF THE INVENTION

In accordance with this invention, methods and apparatus are provided for testing a communication link for one or more types of possible deficiencies and automatically adjusting circuitry associated with the communication link to at least partly counteract detected deficiency. The communication link typically extends between first and second circuits. In accordance with the invention, the communication link is swept with a test signal having time-varying frequency. A possible deficiency of the communication link in transmitting the test signal is monitored, for example, by dividing the frequency of the test signal before and after application to the communication link and comparing phases of signals resulting from such frequency division in order to detect phase shift possibly introduced by the communication link. A circuit component of the communication link is controlled, at least in part, on the basis of this comparison of phases to at least partly counteract any such phase-shift deficiency of the communication link. For example, pre-emphasis given to signals applied to the communication link may be adjusted, and/or equalization given to signals received from the communication link may be adjusted. A second communication link between the first and second circuits may be used to convey some of results of the frequency division between those circuits to facilitate the phase comparison mentioned above. Also to facilitate and/or improve the phase comparison, the amplitude at the output of the test signal may be monitored and kept constant by the use of adjusting circuitry (e.g., an automatic gain control circuit employing feedback).

If desired in addition to the above-mentioned phase comparison, control of the communication link may be based to some degree on determining attenuation (amplitude loss) of the test signal after passage of that signal through the communication link.

Further features of the invention, its nature and various advantages, will be more apparent from the accompanying drawings and the following detailed description.

DETAILED DESCRIPTION

Although the invention is applicable in other contexts, the invention will be fully understood from the following description, which for the most part assumes that the communication being discussed is between two integrated circuit devices. Also for the most part, these two devices are assumed to be programmable logic devices or PLDs, and one device is generally assumed to be the transmitter while the other device is generally assumed to be the receiver. It will be understood, however, that PLDs are only one example of devices that can be equipped with the invention, and that any transmitter or receiver may be both a transmitter and a receiver. Still another assumption that is generally made herein is that the communication is differential signalling. This is not a requirement, however, and the invention is equally applicable to non-differential, single-ended communication. Examples of PLDs that can be augmented to include the present invention are shown in Lee et al. U.S. patent application Ser. No. 10/093,785, filed Mar. 6, 2002; Venkata et al. U.S. patent application Ser. No. 10/195,229, filed Jul. 11, 2002; Venkata et al. U.S. patent application Ser. No. 10/317,262, filed Dec. 10, 2002; Lui et al. U.S. patent application Ser. No. 10/454,626, filed Jun. 3, 2003; Venkata et al. U.S. patent application Ser. No. 10/317,264, filed Dec. 10, 2002; and Venkata et al. U.S. patent application Ser. No. 10/349,541, filed Jan. 21, 2003.

Figure 1:
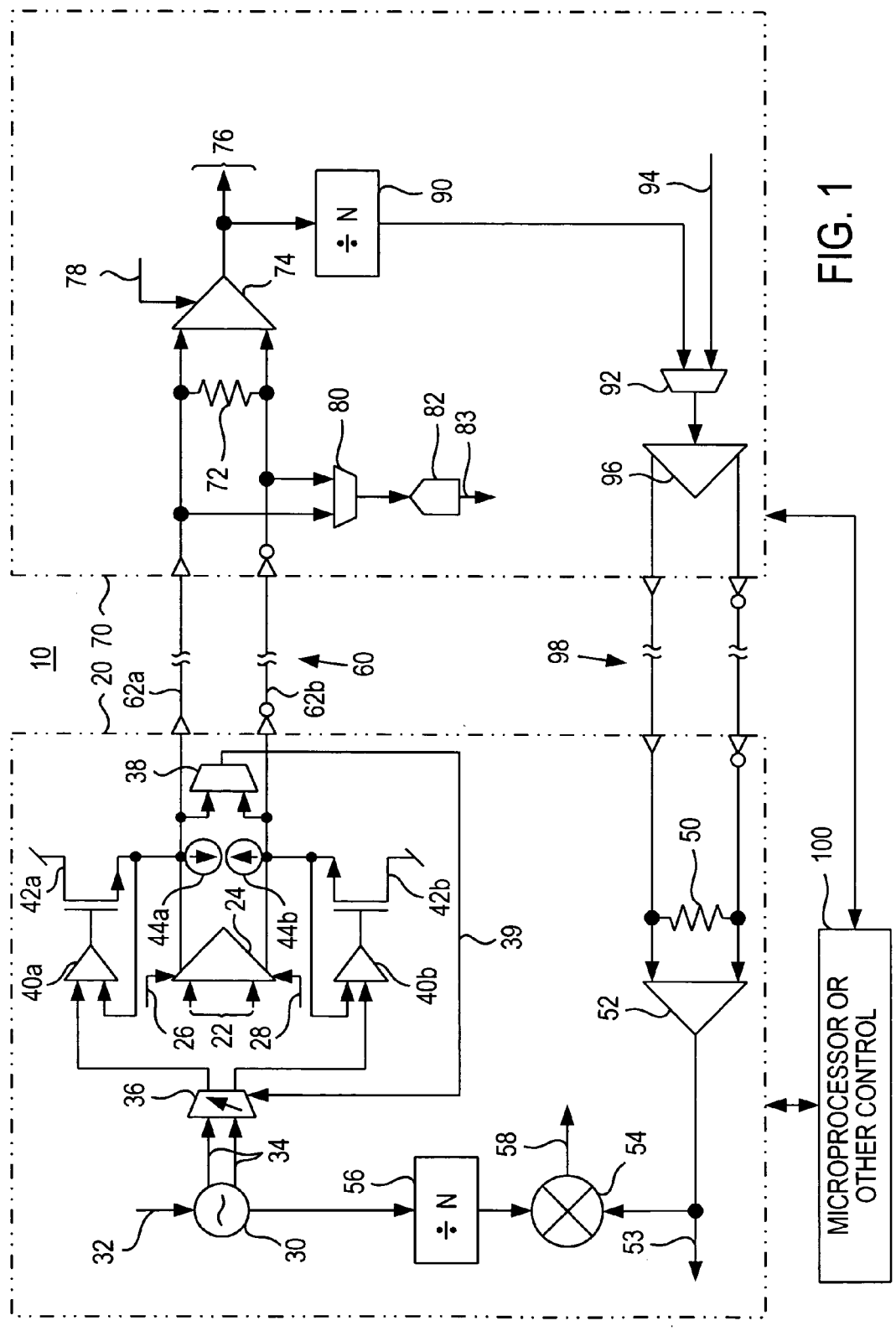
FIG. 1 is a simplified schematic block diagram of an illustrative embodiment of circuitry constructed in accordance with the invention.

In the illustrative system 10 shown in FIG. 1, integrated circuit device 20 is intended as a transmitter of signal information via differential communication link 60 to receiver integrated circuit device 70. This is what may be termed the "normal" operating mode of system 10, which occurs after a preliminary "training" mode of the system that will be the subject of most of the discussion herein. One possible configuration is for a high-speed link 60 to exist next to a low-speed link 98, and so the term "training" is used to describe only the sequence of applied test signals, monitoring, and subsequent application of correction measures such as changing pre-emphasis and/or equalization. Device 20 may be a programmable logic device (PLD) having circuitry that produces or at least passes on a signal 22 (differential or non-differential) to be output via output driver 24. Output driver 24 produces corresponding complementary output signals that are respectively applied to the two conductors 62a and 62b of communication link 60. At the other end of that link, device 70 (which may be, for example, another programmable logic device (PLD)) the received signals are applied (across optional resistor 72) to differential input driver or buffer 74. Buffer 74 typically produces a corresponding (differential or non-differential) output signal 76 for use by other circuitry on device 70 or at least for passing on to still other circuitry or devices.

Because the normal communication circuitry just described may have transmission characteristics (e.g., signal attenuation and phase shift characteristics) that are at least to some extent unpredictable, the circuitry and methods of this invention are provided to initially test the characteristics of link 60 and to automatically adapt at least some of its components (if necessary) to counteract deficiencies in the performance of the link. For example, various undesirable amounts of attenuation and/or phase shift caused by link 60 may be counteracted by adjusting output driver 24 to cause that output driver to give the signal being transmitted various amounts, durations, shapes, etc., of pre-emphasis (i.e., extra energy (voltage and/or current amplitude) after each transition in the signal being transmitted). Alternatively or in addition, various undesirable amounts of attenuation and/or phase shift caused by link 60 may be counteracted by adjusting input driver or buffer 74 to cause that component to give the received signal various amounts, durations, shapes, etc., of equalization (i.e., extra energy or amplitude) after each transition in the received signal. An example of pre-emphasis and equalization circuitry that can be operated in different ways to give different amounts of pre-emphasis and/or equalization is shown in Baig et al. U.S. patent application Ser. No. 10/702,195, filed Nov. 4, 2003. Leads 26 are provided for controlling the operation (pre-emphasis) of output driver 24. Leads 78 are provided for controlling the operation (equalization) of input driver or buffer 74.

In accordance with this invention, prior to normal operation of link 60, output driver 24 is preferably turned off (tri-stated) by a signal on control lead 28. Variable oscillator 30 is then controlled via lead(s) 32 to begin to output differential signals 34 that progress through a predetermined desired range of frequencies that bracket (i.e., extend above and below) the frequency(ies) at which link 60 will operate during subsequent normal operation of system 10. Typically also, oscillator 30 is controlled to progressively step through each of several discretely different frequencies that are spaced from one another across the desired range. Oscillator 30 operates at each of these frequencies for a period of time long enough to gather the desired data regarding the performance of link 60 at that frequency. Control 32 for oscillator 30 may come from microprocessor or other control circuitry 100, which is shown in FIG. 1 as though it is a separate element, but which can be part of device 20 and/or device 70 or included in system 10 in any other desired way. Block 100 represents the componentry that controls the test or training mode of system 10 in accordance with this invention; and that at the conclusion of testing, trains (i.e., controls or programs) components 24 and/or component 74 to operate during subsequent normal operation of the system to counteract deficiencies of link 60 that have been detected during testing.

Oscillator 30 preferably outputs differential sinusoidal signals having the frequency desired at any give time during the test sequence. Although sinusoidal oscillator outputs are thus preferred, periodic signals having other shapes may be used instead if desired.

The output signals of oscillator 30 are preferably applied to variable gain control circuitry 36. Circuitry 38 detects the amplitude of the output signals that are applied to leads 62a and 62b and provides a control signal 39 (feedback) for controlling the gain of circuitry 36 so that the amplitude (power) of the signals applied to leads 62a and 62b remains constant for all of the various frequencies used during test mode.

The output signals of variable gain control circuitry 36 are respectively applied to operational amplifiers 40a and 40b. Each operational amplifier supplies the gate control signal for an associated MOSFET 42a or 42b. MOSFET 42a is an NMOS transistor. MOSFET 42b is a PMOS transistor. The source terminal signal of NMOS transistor 42a is fed back to the second input of operational amplifier 40a, and also connected to lead 62a in cooperation with current source circuitry 44a. The source terminal signal of PMOS transistor 42b is fed back to the second input of operational amplifier 40b, and also connected to lead 62b in cooperation current source circuitry 44b.

The net effect of the circuitry that includes elements 36, 38, 40, 42 and 44 is to apply to leads 62a and 62b differential signals having substantially contant amplitude and the successive different frequencies at which oscillator 30 is operated as test mode operation of the circuitry proceeds.

At receiver device 70, during test mode, any attenuation of the signal received via communication link 60 is preferably monitored by elements 80 and 82. For example, element 80 may be peak detector circuitry (like above-described element 38 in transmitter device 20), and element 82 may be analog-to-digital or quantizer circuitry. One possible way to measure attenuation is to first operate link 60 at low frequency (where little or no attenuation is expected) and save the output 83 of circuitry 82 as a baseline. This baseline value can then be compared to subsequent values of output 83 as communication link 60 is operated at higher frequencies in order to accumulate data indicative of attenuation as a function of frequency. (Determination of such a low-frequency base line attenuation in order to effectively subtract it from attenuation values measured at higher frequencies may be referred to as de-embedding.) Circuitry 100 can store and manipulate outputs 83 in this manner to accumulate the described attenuation vs. frequency information. In addition to accumulating attenuation data, circuitry 100 may use that data as test mode proceeds to adjust the output of device 20 to counteract the attenuation that has been detected. For example, an output from circuitry 100 (based at least in part on data 83 from receiver 70) may supplement or replace the output 39 of circuitry 38 as a control for variable gain circuitry 36. In this way transmitter output power can be increased or decreased to more nearly flatten the response as the sweep frequency (from oscillator 30) is increased. If the system is operated in this way, a record (maintained in circuitry 100) of the amounts by which gain circuitry 36 was adjusted at each different frequency during test mode can be the attenuation-vs.-frequency information for the system.

Also at receiver 70, during test mode, the signal received via communication link 60 is applied to input driver or buffer 74, which is then preferably operated with any equalization capability that it has turned off (i.e., a flat frequency response is desired so that no phase shifting is taking place and is mistaken as a link impediment if no further de-embedding of the link and associated circuitry is performed). Note that any small phase shift at low frequencies may be negligible, but propagation delays attributable to the associated circuitry such as 74 may not be. Accordingly, de-embedding (the process of measuring the phase at low frequency and then subtracting those results from all further measurements at higher frequencies) eliminates this variable, should it be significant. This type of phase shift de-embedding can be similar to the above-described attenuation de-embedding, and it can be performed in the same general way and by the same means as described above for attenuation de-embedding. Either or both of attenuation and phase shift de-embedding can be performed as desired.

Although the received test signal is preferably sinusoidal or relatively sinusoidal as described earlier in connection with the discussion of oscillator 30, input driver or buffer 74 is typically designed to receive and output digital (two-level) signals, which the normal mode signals will be in most cases. Accordingly, input buffer 74 tends to convert a received sinusoidal test mode signal to an output signal 76 that is more like a square-wave, i.e., with fairly abrupt changes in level associated with axis crossings in the received signal. Output signal 76 has the same frequency as the ultimate source test signal (produced by oscillator 30), but its phase may have shifted relative to oscillator 30 as a result of passing through communication link 60 (now also including receiver buffer 74).

The test mode output signal of input driver or buffer 74 is applied to frequency divider circuit 90, which divides the frequency of the received test mode signal by a factor N. The output signal of divider 92 is one of the inputs to multiplexer 92, which during test mode is controlled to apply the divider output signal (rather than a normal mode output signal 94) to output driver 96. Output driver 96 applies the signal it receives to differential communication link 98 for passage back to device 20.

At device 20 the test mode signal received via link 98 is applied (across optional resistor 50) to input buffer 52. Input buffer 52 converts the differential signal it receives to a single-ended signal and applies that signal to one input of phase comparison circuit 54. The other input to phase comparison circuit 54 is an output signal of oscillator 30 that has been divided in frequency by frequency divider circuit 56. In particular, this output of oscillator 30 has the same frequency and phase as the test mode signal(s) oscillator 30 concurrently applies to variable gain circuit 36 as described earlier. In addition, the factor N that divider circuit 56 employs is the same factor N concurrently employed by divider circuit 90.

Any phase shift experienced by the test mode signal in traveling through communication link 60 is preserved by the operation of divider circuit 90. Among its effects, divider 90 extends the allowable phase range by 360° times the divider ratio. An example follows: If the phase shift encountered on the high-speed link is 362°, then this phase shift appears as 181° after a divide-by-two takes place on the low-speed link. This is because the divide-by-two signal has twice the period now, but the absolute phase shift in time (e.g., in picoseconds) remains the same before and after the divider.

Divider circuit 90 reduces the frequency of the received, possibly phase-shifted, test mode frequency for transmission back to device 20 via communication link 98. The frequency reduction effected by divider 90 is preferably great enough so that the signal transmitted back to device 20 does not experience any significant further phase shift in propagating through communication link 98 and its associated circuit elements 92, 96 and 52. The test mode output signal of input buffer 52 therefore contains the same phase shift information as the concurrent test mode output signal of input buffer 74. All phase shifts and attenuation are recorded at very low test frequencies and subsequently subtracted from higher test frequency phase and attenuation information. This is in essence a de-embedding step (also mentioned earlier) that eliminates most of the effects associated with in-line circuitry in series with the link under test (e.g., if the equalizer 74 and transmitter 96 in receiver 70 still introduce a phase shift at low frequencies (which may result from propagation delay of circuit elements only), that can be nulled out as just described).

The output signal of divider circuit 56 similarly contains phase information for the concurrent, source, test mode output of oscillator 30. Phase comparison circuit 54 compares the phases of the two signals it receives and produces an output signal 58 indicative of any difference in those phases. Accordingly, the output signal 58 of phase comparator 54 indicates the phase shift, if any, experienced by the test mode signal in propagating through communication link 60. As oscillator 30 progressively operates at different frequencies throughout the test mode frequency range, output signal 58 progressively indicates the communication link 60 phase shift for reach of the frequencies tested. Circuit 100 typically stores or otherwise accumulates this phase shift vs. frequency information 58 as test mode operations proceed. A low-frequency, baseline phase shift value may be subtracted from higher-frequency phase shift values in the accumulated phase shift vs. frequency information. This is the de-embedding process mentioned above.

Although the foregoing may imply use of a constant value of N in both of frequency dividers 56 and 90, N can be changed as test mode proceeds. For example, at relatively low test frequencies, N may be relatively low if it is not necessary to greatly reduce the frequency in communication link 98 to avoid additional phase shift in that link. At higher test frequencies, N may be increased to keep the frequency in communication link 98 relatively low to continue to avoid additional phase shift in that link. Of course, any change in N is preferably made simultaneously in both of circuits 56 and 90.

After all desired test mode frequencies have been employed and the attenuation (83) and phase shift (58) response of communication link 60 has been recorded or otherwise captured (e.g., by circuitry 100), that information may be analyzed (again, typically by circuitry 100) to determine how to adjust one or more of the circuit elements serving communication link 60 to counteract the deficiencies (e.g., attenuation and/or phase shift) of that link to thereby improve the performance of the link during subsequent normal operation of the circuitry. For example, circuitry 100 may determine, based on the test mode information that has been accumulated (and possibly also other information such as the frequency(ies) at which communication link 60 will be operated during normal operation mode), that a certain amount, duration, and/or shape of pre-emphasis should be made part of the operation of output driver 24. In order to accomplish that, circuitry 100 may apply control signals 26 to driver 24 appropriate to configure driver 24 to subsequently operate (i.e., in normal operation mode) with such pre-emphasis. Alternatively or in addition, circuitry may determine that a certain amount, duration, and/or shape of equalization should be made part of the operation of input buffer 74. To accomplish that, circuitry 100 may apply control signals 78 to buffer 74 appropriate to configure buffer 74 to subsequently operate (i.e., in normal operation mode) with such pre-emphasis.

Any of several techniques may be used to analyze the information (58 and 83) that is gathered during test mode to adapt the circuitry as described above for better performance during subsequent normal operation. For example, a look-up table of responses appropriate to various types and amounts of communication link deficiencies detected during test mode may be used. As another example, an algorithm may be performed using the test mode information (58 and 83) to determine the appropriate response to that particular test mode experience.

Signals 26 and/or 78 may control components 24 and/or 74 in any way appropriate to the construction of those components. For example, if component 24 includes multi-tap pre-emphasis circuitry, signals 26 may control or program component 24 to turn on certain of those taps while turning off others of those taps. As another example, signals 26 may control or program component 24 to select a clock speed for use in the pre-emphasis circuitry of component 24 to lengthen or shorten the duration of the pre-emphasis (or various parts of the pre-emphasis) given to a normal mode signal handled by component 24. These examples are equally applicable to controlling the equalization effected by input buffer 74.

At the conclusion of test mode operation, and after any appropriate adjustments have been made to the circuitry (e.g., via leads 26 and 78) as described above, the test mode components of the circuitry can be disabled and any normal mode components that are not already enabled can be enabled. For example, such test mode components as elements 30, 36, 40, 42, 44, 58, 80, 82, 90, 54, and 56 can be disabled. Previously tri-stated normal mode output driver 24 can be enabled, and multiplexer 92 can be switched from (1) connecting divider 90 to driver 96 to (2) switching normal mode signal lead 94 to driver 96. Communication link 60 can thereafter be used to transmit signal 22 from device 20 to device 70 lead 76. The normal mode performance of communication link 60 will be improved by any adjustments that have been made (via leads 26 and/or 78) to components 24 and/or 74. (Note that link 98 can be used for normal mode communication in the opposite direction (i.e., from device 70 lead 94 to device 20 lead 53).)

Although FIG. 1 shows only one communication link 60 equipped for test mode testing and possible adjustment prior to normal mode operation, it will be understood that any number of such links can be thus equipped, and that those links can be variously adapted to convey signals either from device 20 to device 70 (as in the case of link 60) or in the opposite direction from device 70 to device 20. For example, a link like link 60 can be used, if desired, to transmit the phase information. This would mean substitution of the more complex type of transmitter shown in circuit 20 for transmitter 96. Similarly, the receiver 52 in circuitry 20 may be replaced by the type of receiver shown in circuitry 70.

Figure 2:
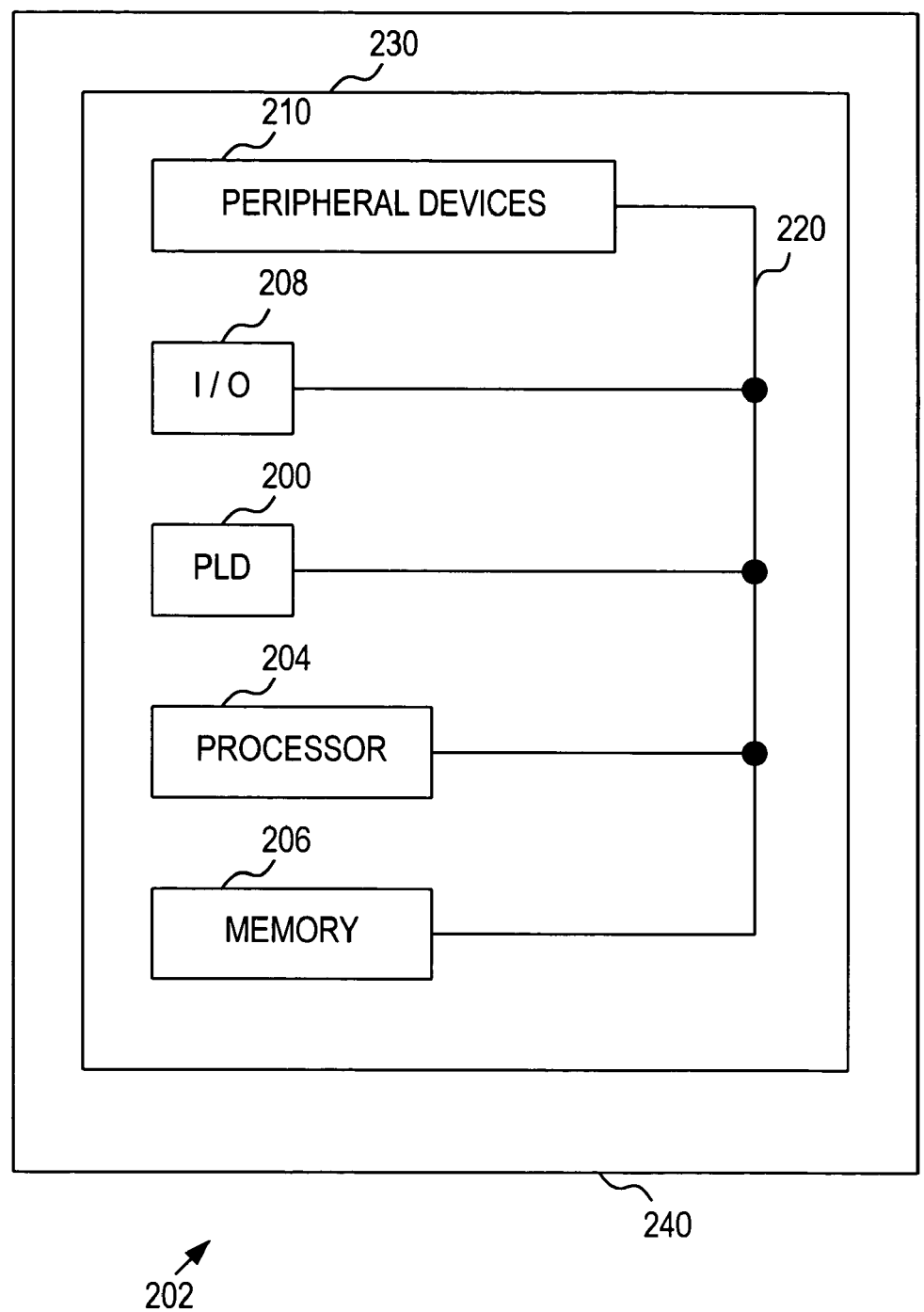
FIG. 2 is a simplified block diagram of an illustrative larger system that can be constructed in accordance with the invention.

FIG. 2 illustrates a programmable logic device (PLD) 200 of this invention in a data processing system 202. For example, PLD 200 can be or include either circuit 20 or circuit 70 in FIG. 1, and the remaining FIG. 1 circuitry can be included in any other device or devices in FIG. 2 that PLD 200 communicates with. Processor 204 in FIG. 2 can perform the functions of element 100 in FIG. 1, although other ways of performing those functions are also possible as mentioned earlier. Data processing system 202 may include one or more of the following components: a processor 204; memory 206; I/O circuitry 208; and peripheral devices 210. These components are coupled together by a system bus 220 and are populated on a circuit board 230 (e.g., a printed circuit board), which is contained in an end-user system 240.

System 202 can be used in any of a wide variety of applications, such as computer networking, data networking, instrumentation, video processing, digital signal processing, or any other application where the advantage of using programmable or reprogrammable logic is desirable. Programmable logic device 200 can be used to perform a variety of different logic functions. For example, programmable logic device 200 can be configured as a processor or controller that works in cooperation with processor 204. Programmable logic device 200 may also be used as an arbiter for arbitrating access to a shared resource in system 202. In yet another example, programmable logic device 200 can be configured as an interface between processor 204 and one of the other components in system 202. It should be noted that system 202 is only exemplary, and that the true scope and spirit of the invention should be indicated by the following claims.

It will be understood that the embodiments shown and described herein are only illustrative, and that various modifications can be made by those skilled in the art without departing from the scope and spirit of the invention. For example, circuitry 100 can take any of many different forms. Circuitry 100 can be wholly separate from devices 20 and 70, or it can partly or wholly part of either or both of devices 20 and 70. If either or both devices 20 and 70 are PLDs, circuitry 100 can be wholly or partly implemented in the programmable logic circuitry of those devices, or in so-called hard or soft IP (intellectual property) of those devices. As another example of modifications within the scope of the invention, phase comparison circuitry 58 could be moved from device 20 to device 70, and the direction of communication link 98 could be reversed so that the phase comparison is performed in device 70 rather than in device 20 as shown in FIG. 1.

What is claimed is:

1. Apparatus for at least partly counteracting a deficiency of a communication link between first and second circuits comprising:
   first circuitry for sweeping the communication link with a test signal having time-varying frequency;
   second circuitry for monitoring a deficiency of the communication link in transmitting the test signal, the second circuitry including dividing frequency of the test signal before and after application to the communication link and comparing phases of signals resulting from such frequency division; and
   third circuitry for controlling a circuit component of the communication link based at least in part on the comparing of phases.

2. The apparatus defined in claim 1 wherein the first circuitry comprises:
   circuitry for maintaining power of the test signal substantially constant for all of its frequencies.

3. The apparatus defined in claim 1 wherein the second circuitry comprises:
   circuitry for determining attenuation of the test signal after passage of the test signal through the communication link.

4. The apparatus defined in claim 1 wherein the third circuitry comprises:
   circuitry for implementing a pre-emphasis characteristic given to signals applied to the communication link.

5. The apparatus defined in claim 4 wherein the pre-emphasis characteristic comprises a selectable, multi-tap pre-emphasis characteristic.

6. The apparatus defined in claim 1 wherein the third circuitry comprises:
   circuitry for implementing an equalization characteristic given to signals received from the communication link.

7. The apparatus defined in claim 3 wherein the third circuitry additionally controls a circuit component of the communication link based at least in part on attenuation determined by the circuitry for determining attenuation.

8. The apparatus defined in claim 1 wherein the second circuitry comprises:
a second communication link between the first and second circuits for communicating a signal resulting from the frequency division between the first and second circuits.

9. The apparatus defined in claim 1 wherein the second circuitry de-embeds a value of the deficiency detected at a relatively low frqency from values of the deficiency detected at frequencies higher than the relatively low frequency.

10. The appartus defined in claim 9 wherein the deficiency includes at least one of attenuation and phase shift of the test signal after passage through the communication link.

11. A programmable logic device including a portion of the apparatus defined in claim 1.

12. A digital processing system comprising:
processing circuitry;
a memory coupled to the processing circuitry; and
a programmable logic device as defined in claim 11 coupled to the processing circuitry and the memory.

13. A printed circuit board on which is mounted a programmable logic device as defined in claim 11.

14. The printed circuit board defined in claim 13 further comprising:
a memory mounted on the printed circuit board and coupled to the programmable logic device.

15. The printed circuit board defined in claim 13 further comprising:
processing circuitry mounted on the printed circuit board and coupled to the programmable logic device.

16. A method of at least partly counteracting a deficiency of a communication link comprising:
sweeping the communication link with a test signal having time-varying frequency;
monitoring a deficiency of the communication link in transmitting the test signal, the monitoring including dividing frequency of the test signal before and after passage through the communication link and comparing phases of signals resulting from that frequency division; and
controlling a circuit component of the communication link based at least in part on the comparing of phases.

17. The method defined in claim 16 further comprising:
maintaining amplitude of the test signal substantially constant for all of its frequencies.

18. The method defined in claim 16 wherein the monitoring further includes:
determining attenuation of the test signal after the test signal has passed through the communication link.

19. The method defined in claim 18 further comprising:
using results of the comparing of phases and the determining attenuation to obtain attenuation and phase shift characteristics of the communication link.

20. The method defined in claim 16 wherein the controlling comprises:
implementing a pre-emphasis characteristic given to signals applied to the communication link.

21. The method defined in claim 16 wherein the controlling comprises:
implementing an equalization characteristic given to signals received from the communication link.

22. The method defined in claim 18 wherein the controlling is additionally based at least in part on attenuation determined in the determining.

23. The method defined in claim 16 wherein the monitoring further includes de-embedding a value of the deficiency detected at a relatively low frequency from values of the deficiency detected at frequencies higher than the relatively low frequency.

24. The method defined in claim 23 wherein the deficiency includes at least one of attenuation and phase shift of the test signal after passage through the communication link.

25. Apparatus for detecting and at least partly counteracting deficiencies in a communication link between first and second circuits comprising:
first circuitry for applying to the communication link at the first circuit a test signal having frequency that varies over time within a predetermined frequency range;
second circuitry for detecting attenuation of the test signal as received by the second circuit and as a function of frequency;
third circuitry for dividing the frequency of the test signal as applied to the communication link;
fourth circuitry for dividing the frequency of the test signal as received by the second circuit;
fifth circuitry for comparing phases of signals having frequency divided by the third and fourth circuitries to detect phase shift of the test signal as received by the second circuit and as a function of frequency; and
sixth circuitry for adjusting circuitry associated with the communication link to counteract the attenuation and/or phase shift.

26. The apparatus defined in claim 25 wherein the sixth circuitry comprises:
microprocessor circuitry.

27. The apparatus defined in claim 25 wherein the sixth circuitry comprises:
programmable logic device circuitry.

28. The apparatus defined in claim 27 wherein at least part of operation of the sixth circuitry is performed by soft IP of the programmable logic device circuitry.

29. The apparatus defined in claim 27 wherein at least part of operation of the sixth circuitry is performed by hard IP of the programmable logic device circuitry.

30. The apparatus defined in claim 25 wherein at least part of operation of the sixth circuitry comprises use of a look-up table.

31. The apparatus defined in claim 25 wherein at least part of operation of the sixth circuitry comprises use of an algorithm.

32. The apparatus defined in claim 25 wherein the first circuit includes the first, third, and fifth circuitries, wherein the second circuit includes the second and fourth circuitries, and wherein the apparatus further comprises:
a second communication link between the first and second circuits for conveying an output of the fourth circuitry to the fifth circuitry.

33. The apparatus defined in claim 25 wherein the sixth circuitry adjusts pre-emphasis given to signals applied to the communication link.

34. The apparatus defined in claim 33 wherein the sixth circuitry adjusts amount of the pre-emphasis.

35. The apparatus defined in claim 33 wherein the sixth circuitry adjusts duration of the pre-emphasis.

36. The apparatus defined in claim 33 wherein the sixth circuitry adjusts shape of the pre-emphasis.

37. The apparatus defined in claim 33 wherein the sixth circuitry adjusts number of taps in multi-tap pre-emphasis circuitry.

38. The apparatus defined in claim 25 wherein the sixth circuitry adjusts equalization given to signals received from the communication link.

39. The apparatus defined in claim 38 wherein the sixth circuitry adjusts amount of the equalization.

40. The apparatus defined in claim 38 wherein the sixth circuitry adjusts duration of the equalization.

41. The apparatus defined in claim 38 wherein the sixth circuitry adjusts shape of the equalization.

42. The apparatus defined in claim 38 wherein the sixth circuitry adjusts number of taps in multi-tap equalization circuitry.

* * * * *